(12) United States Patent
Nathawad et al.

(10) Patent No.: US 7,414,555 B1
(45) Date of Patent: Aug. 19, 2008

(54) INTERLEAVED ADC AND FOLDED MIXER FOR WLAN DEVICES

(75) Inventors: Lalitkumar Nathawad, Santa Clara, CA (US); David J. Weber, Santa Clara, CA (US); Masoud Zargari, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 0 days.

(21) Appl. No.: 11/531,677

(22) Filed: Sep. 13, 2006

Related U.S. Application Data (60) Provisional application No. 60/717,853, filed on Sep. 16, 2005.

(51) Int. Cl.
*H03M 1/00* (2006.01)
(52) U.S. Cl. ...................................... 341/122; 341/155
(58) Field of Classification Search ................. 341/122, 341/155, 172
See application file for complete search history.

(56) References Cited

U.S. PATENT DOCUMENTS

| | | | | |
|---|---|---|---|---|
| 5,159,341 A | * | 10/1992 | McCartney et al. | 341/143 |
| 5,557,187 A | * | 9/1996 | Koch et al. | 320/166 |
| 6,097,326 A | * | 8/2000 | Opris et al. | 341/161 |
| 6,107,871 A | * | 8/2000 | Shin | 327/554 |
| 6,839,009 B1 | * | 1/2005 | Ali | 341/118 |
| 6,853,241 B2 | * | 2/2005 | Fujimoto | 330/9 |
| 6,937,174 B2 | * | 8/2005 | Higashi et al. | 341/122 |
| 6,954,159 B1 | * | 10/2005 | Cooper et al. | 341/143 |
| 6,967,611 B2 | * | 11/2005 | Atriss et al. | 341/172 |

\* cited by examiner

*Primary Examiner*—Peguy JeanPierre
(74) *Attorney, Agent, or Firm*—Bever, Hoffman & Harms, LLP; Jeanette S. Harms (57) ABSTRACT

An interleaved ADC can advantageously provide synchronous sampling and time-multiplexed output. Differential I and Q input signals can first be stored by charging a plurality of capacitors. These stored differential signals can be buffered in a time-multiplexed sequence. For example, buffering can include transferring voltages stored by a first set of capacitors at a first time and then transferring voltages stored by a second set of capacitors at a second time. Advantageously, this time-multiplexing allow the ADC to be significantly smaller than conventional implementations of two-input ADCs. A folded mixer with gain control is also provided. This mixer can include a first stage having a first set of inductors and a plurality of first type transistors and a second stage having a second set of inductors and a plurality of second type transistors. The plurality of second type transistors in the second stage, which are in a folded configuration, can be driven by the first set of inductors in the first stage. The outputs of the mixer are positioned between the plurality of second type transistors and the second set of inductors. This configuration advantageously permits the mixer to use a low operating voltage.

6 Claims, 7 Drawing Sheets

INTERLEAVED ADC AND FOLDED MIXER FOR WLAN DEVICES

RELATED APPLICATIONS

This application claims priority of U.S. Provisional Patent Application 60/717,853, entitled "An IEEE 802.11a/b/g SoC For Embedded WLAN Applications" filed Sep. 16, 2005.

BACKGROUND OF THE INVENTION

1. Field of the Invention

The present invention relates to an analog to digital converter (ADC) that provides synchronous sampling and time-multiplexed output. The present invention further relates to a folded mixer with gain control.

2. Related Art

The growing market for wireless voice-over-IP, network gaming, and internet services has fueled the demand for compact, low-power, low-cost wireless LAN (WLAN) solutions suitable for battery-operated handheld devices such as cell phones, PDAs, and portable gaming consoles. The majority of conventional WLAN devices operate in the unlicensed 2.4 GHz band and implement the IEEE 802.11 b/g standards. However, spectral crowding at 2.4 GHz and the abundance of unlicensed bandwidth at 5 GHz has resulted in greater demand for dual-band WLAN products that also support IEEE 802.11a.

Therefore, it would be desirable to implement a 0.18 μm CMOS, dual-band IEEE 802.11a/b/g WLAN SoC designed for low-power, reduced area embedded applications.

SUMMARY OF THE INVENTION

In accordance with one aspect of the invention, a two-input sample/hold circuit of an analog to digital converter (ADC) can advantageously provide synchronous sampling of both inputs and time-multiplexed output. In one embodiment, the sample/hold circuit can include an amplifier, two feedback lines connected to outputs of the amplifier, four capacitors, and four switch sets. The first switch set can selectively connect the first terminals of the first, second, third, and fourth capacitors to differential I and Q input terminals of the ADC. The second switch set can selectively connect the second terminals of the first and second capacitors to input terminals of the amplifier and can selectively connect the first terminals of the first and second capacitors to the first and second feedback lines. The third switch set can selectively connect second terminals of the third and fourth capacitors to the input terminals of the amplifier and can selectively connect the first terminals of the third and fourth capacitors to the first and second feedback lines. The fourth switch set can selectively connect the second terminals of the first, second, third, and fourth capacitors to a predetermined voltage to ensure proper charging.

In this configuration, the differential I and Q input signals can first be stored by charging the first, second, third, and fourth capacitors (i.e. closing the first and fourth switch sets, the second and third switch sets being open). Then, these stored differential I and Q input signals can be buffered in a time-multiplexed sequence. In one embodiment, buffering the stored differential I and Q input signals can include transferring the voltage differential stored by a first set of capacitors to the output of the amplifier at a first time (e.g. closing the second switch set, and the first, third, and fourth switch sets being open) and then transferring the voltage differential stored by a second set of capacitors to the output of the amplifier at a second time (e.g. closing the third switch set, and the first, second, and fourth switch sets being open). Advantageously, this configuration and time-multiplexing allow the ADC including the sample/hold circuit to be significantly smaller than conventional implementations of two single-input ADCs.

In accordance with another aspect of the invention, a mixer with gain control can include two stages, wherein the first stage has a first set of inductors and a plurality of first type transistors and the second stage has a second set of inductors and a plurality of second type transistors. The plurality of second type transistors in the second stage, which are in a folded configuration, can be driven by the first set of inductors in the first stage. The outputs of the mixer are positioned between the plurality of second type transistors and the second set of inductors. This configuration, although needing space for two inductor sets, advantageously permits the mixer to use a low operating voltage.

DETAILED DESCRIPTION OF THE FIGURES

Figure 1:
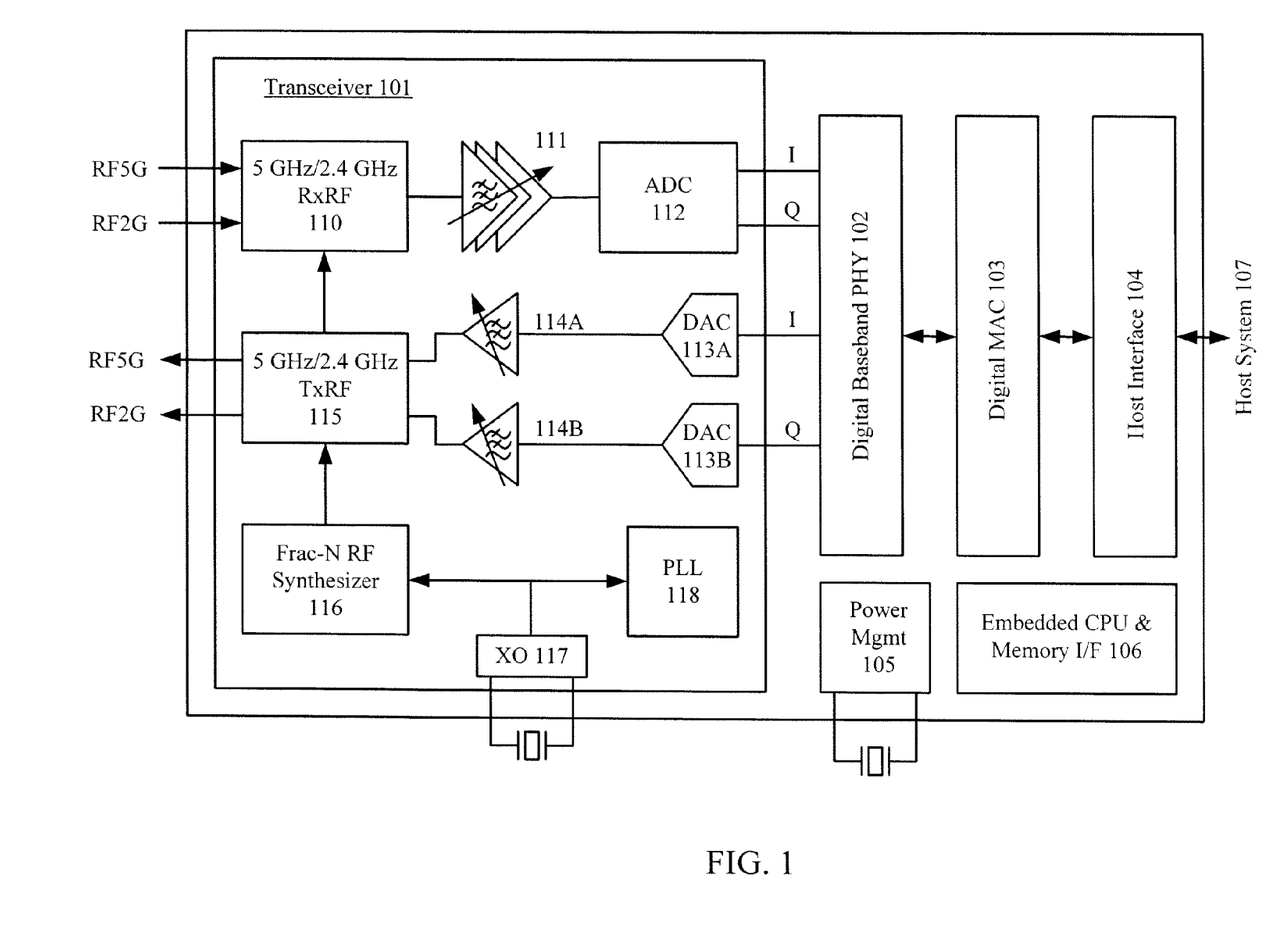
FIG. 1 illustrates an exemplary system-on-chip (SoC) that includes a dual-band 5 GHz/2.4 GHz radio frequency (RF) transceiver.

FIG. 1 illustrates a schematic of a simplified SoC 100 that includes a dual-band 5 GHz/2.4 GHz RF transceiver 101, a digital baseband physical (PHY) layer 102, a digital media access control (MAC) layer 103, and a host interface 104. RF transceiver 101 includes a receive antenna 110 that can receive the incoming 5/2.4 GHz signals. Various filters, mixers, and variable amplifiers, labeled as components 111, can modify the frequencies and amplitudes of those signals to generate signals in the desired channel, i.e. baseband signals, in both the I and Q branches. At this point, analog to digital converters 112 transform the amplified baseband signals into digital signals that can be provided to PHY layer 102.

In general, PHY layer 102 includes the mechanisms and technologies for the transmission and receipt of baseband 802.11 signals. Additionally, PHY layer 102 can provide additional functionality including, but not limited to, assessing the state of the wireless medium and reporting that state to MAC layer 103. In turn, MAC layer 103 manages and maintains communications between 802.11 stations by coordinating access to a shared radio channel and utilizing protocols to optimize wireless communications. For example, MAC layer 103 can perform authentication, association, and encoding/decoding functions. Host interface 104 can include the specific interface(s) (e.g. PCI, CardBus, etc.) to facilitate communication with a host system 107.

In addition to the receive path described above, transceiver 101 also includes a transmit path. This transmit path includes digital to analog converters (DACs) 113A/113B that receive digital signals, in both the I and Q branches, from PHY layer 102 and convert those digital signals into analog signals. Those analog signals are modified using various filters, mixers, and variable amplifiers, labeled as components 114A/114B, to generate RF signals that can be sent by transmit antenna 115 in the 5 GHz or 2.4 GHz band.

Transceiver 101 further includes an oscillator 117 that generates a reference frequency. A fractional-N RF synthesizer 116 can use that reference frequency to generate signals with the desired operating frequencies, i.e. frequencies in the 5 GHz or 2.4 GHz band. A phase-locked loop (PLL) 118 provides a feedback to synthesizer 116 to minimize the variation in the desired transmit frequency.

SoC 100 further includes a power management block 105 and an embedded CPU and memory interface 106, both of which are found in standard wireless systems. In one embodiment, SoC 101 supports multiple crystal/external clock frequencies to allow sharing of clock resources with host system 107.

Figure 2A:
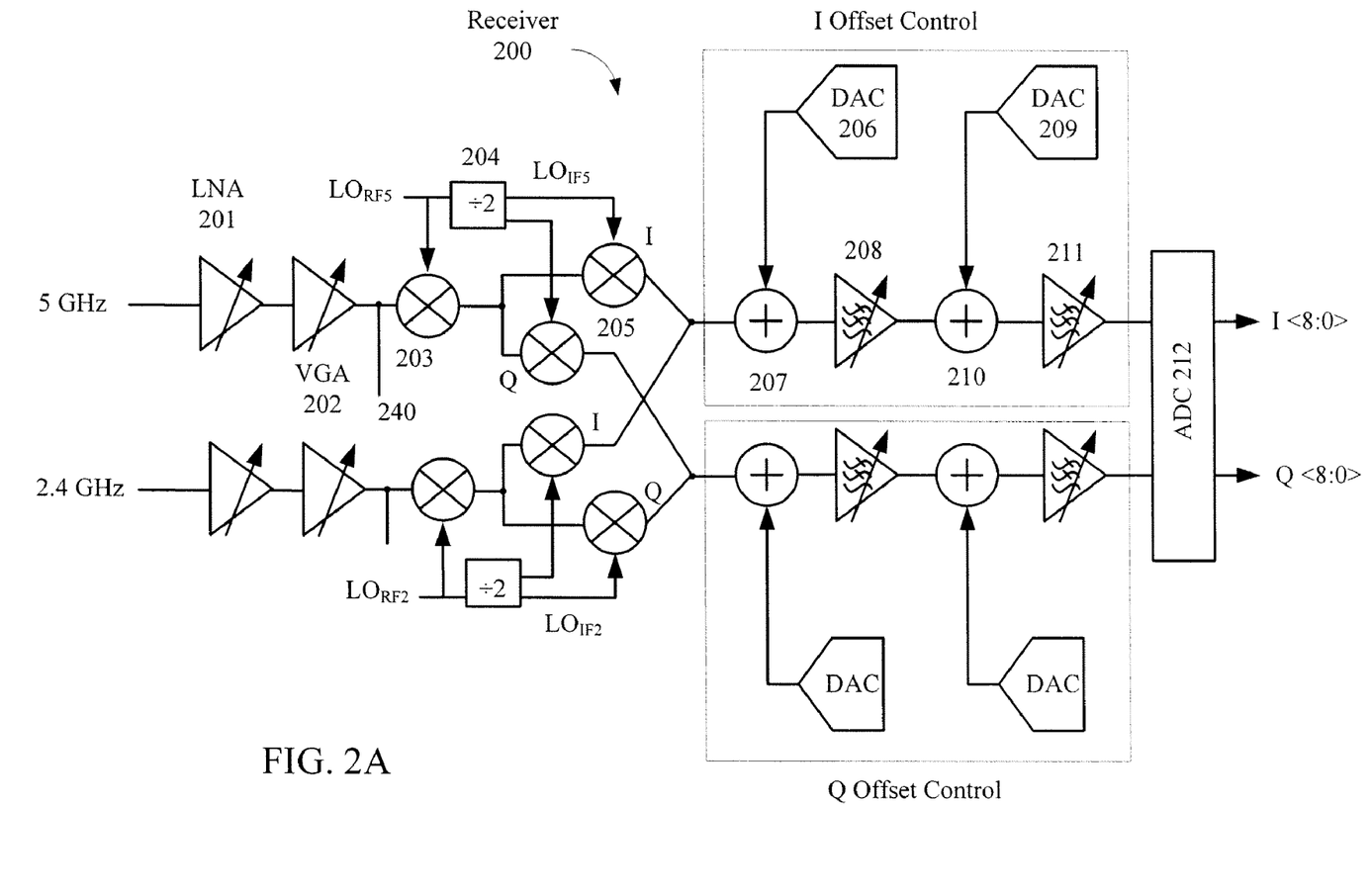
FIG. 2A illustrates a receive path for an exemplary receiver.

FIG. 2A illustrates a block diagram of RF receive paths for a receiver 200. In this embodiment, a low noise amplifier (LNA) 201 and a variable gain amplifier 202 provide an initial amplification to a received 5 GHz signal. Mixer 203 receives the amplified output of VGA 202 as well as a local oscillator $LO_{RF5}$ signal to generate a mixed signal. Mixers 205 receive this mixed signal as well as the $LO_{IF5}$ signal generated by block 204 (describe below) to generate both in-phase (I) and quadrature (Q) components. In this embodiment, the $LO_{IF5}$ signals for mixers 205 can be generated by a local resistively-loaded divide-by-2 block 204. Note that with multiple, distributed LO divide-by-2 blocks, the load capacitance seen by each divide-by-2 block is sufficiently small that inductive tuning and the associated area penalty can be avoided.

At this point, filters 208 and 211 (in the I branch) can generate baseband signals in the desired channel and amplify those baseband signals. In one embodiment, filters 208 and 211 can be implemented by programmable-gain fourth order Butterworth gm-C filters to provide low-pass filtering. Note that digital to analog converters 206 and 209 as well as adders 207 and 210 can provide I offset control as filters 208 and 211 perform their filtering and amplifying. Analog to digital converters (ADCs) 212 transform the amplified analog baseband signals into digital baseband signals that can be analyzed by a processing block (see, e.g. FIG. 1). Note that components for receiving a 2.4 GHz signal and processing signals in the Q branch are identical to those described above (i.e. for receiving a 5 GHz signal and processing signals in the I branch) and therefore are not described in detail herein. Further note that both the 5 GHz and 2.4 GHz receive signal paths share the same analog baseband circuits.

Figures 2B, 2C:
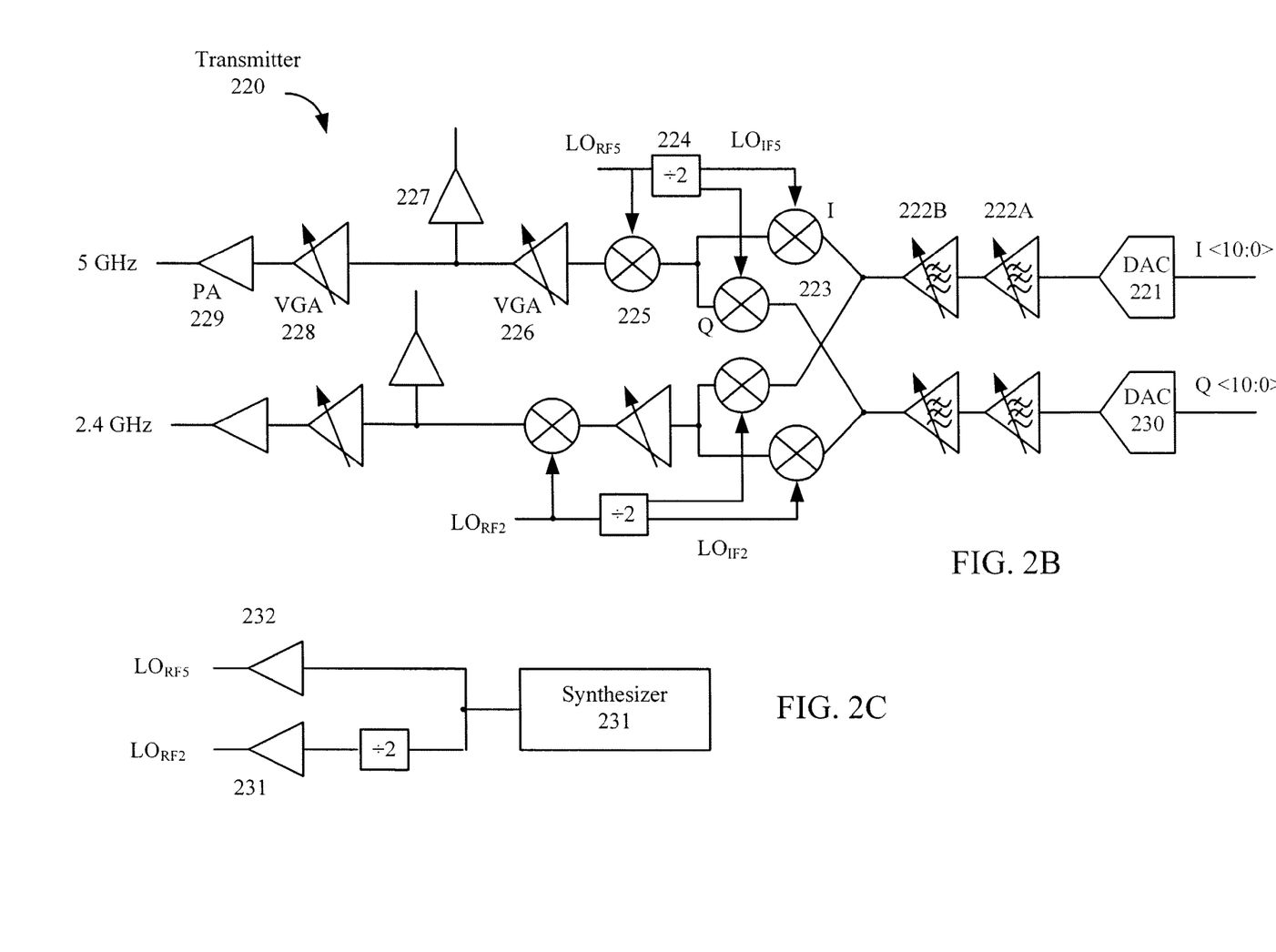
FIG. 2B illustrates a transmit path for an exemplary transmitter.
FIG. 2C illustrates a synthesizer circuit for generating the local oscillator signals for 5 and 2.4 GHz.

FIG. 2B illustrates a block diagram of RF transmit paths for a transmitter 220. A digital to analog converter (e.g. a two-bit, 176 megasamples per second, current-steering DAC) 221 can receive its digital input and generate an analog output that is subsequently low-pass filtered and amplified by filters (e.g. third-order Butterworth gm-C low-pass filter) 222A and 222B. Thus, similar to receiver 200, the 5 GHz and 2.4 GHz RF transmit paths of transmitter 220 share the same analog baseband circuits. Mixers 223 receive the I and Q components (the I component being provided by DAC 221 and the Q component being provided by DAC 230) as well as the $LO_{IF5}$ signal to generate mixed signals. Mixer 225 receives a composite mixed signal (I and Q) as well as the $LO_{RF5}$ signal to generate a signal that is then amplified by a VGAs 226 and 228. In one embodiment, an RF loop back path from the output of VGA 226 (via buffer 227) to the input of mixer 203 (see line 240 in FIG. 2A) enables digital correction of RF impairments such as DC offset, I-Q mismatch, and RF carrier leak. A power amplifier (PA) 229 can provide the final amplification to the 5 GHz transmit signal. In one embodiment, the RF local oscillator ($LO_{RF}$) and IF local oscillator ($LO_{IF}$) frequencies are at ⅔ $f_{RF}$ and ⅓ $f_{RF}$, respectively.

In one embodiment shown in FIG. 2C, a fractional-N frequency synthesizer 231 with a tuning range from 3.08-4 GHz can generate the $LO_{RF5}$ and $LO_{RF2}$ signals for both receiver 200 and transmitter 220. In the 802.11b/g (2.4 GHz) modes, the synthesizer output is divided by two to generate $LO_{RF2}$ (1.6 GHz) In the 802.11a (5 GHz) mode, the synthesizer output provides $LO_{RF5}$ (3.6 GHz) directly.

$LO_{RF2}$ and $LO_{RF5}$ can be distributed to their respective transmit/receive paths using inductively-tuned LO buffers 231 and 232, respectively. Note that LO buffer 232 at 3.6 GHz can require a large amount of power to guarantee sufficient LO amplitude over process, voltage and temperature variations. Therefore, an automatic gain control (AGC) loop can be employed in $LO_{RF5}$ buffer 232 to minimize power consumption under typical operating conditions.

Figure 3A:
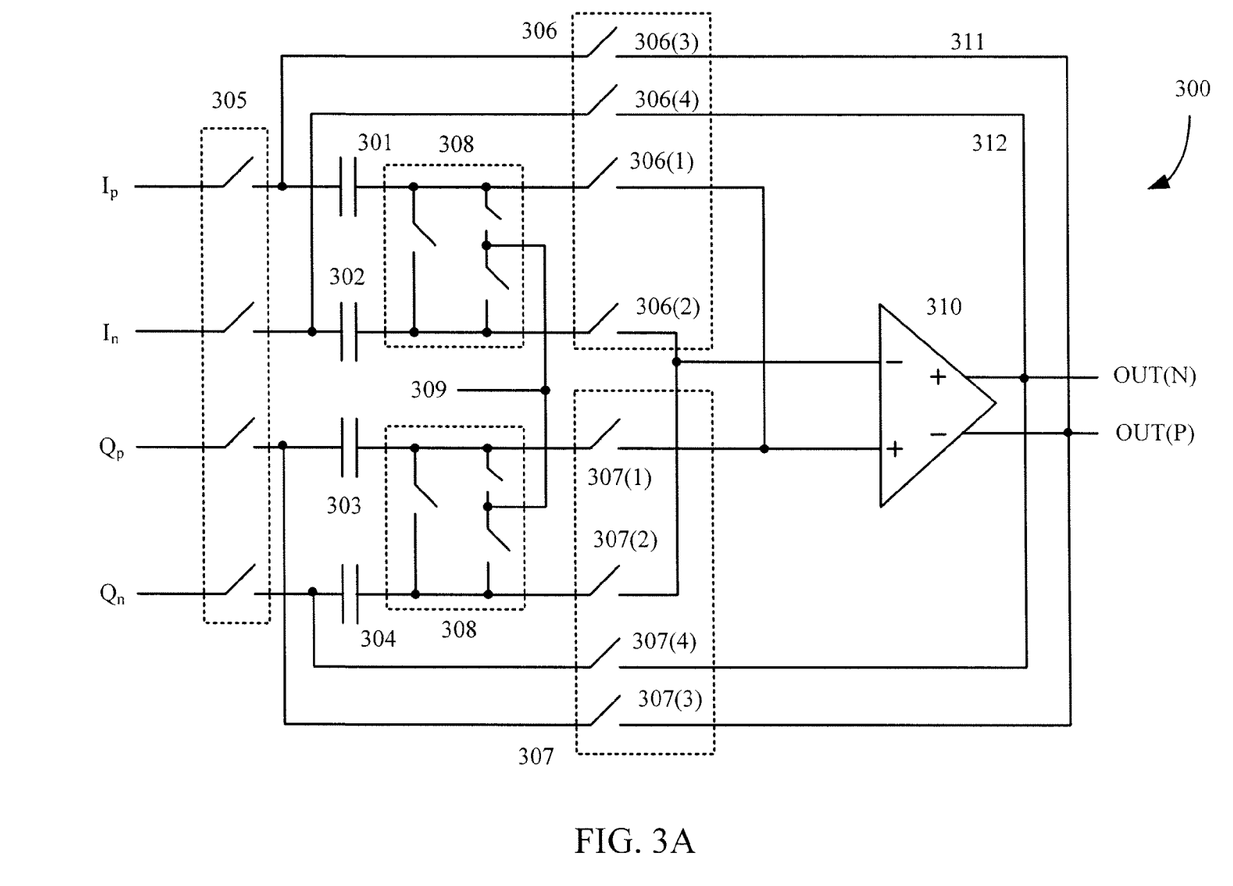
FIG. 3A illustrates an exemplary sample/hold circuit of an analog to digital converter (ADC) with synchronous sampling of the dual inputs and time-multiplexed output.

In accordance with one aspect of the invention, dual ADCs 212 can be implemented with two-input ADCs having a sample/hold feature. For example, FIG. 3A illustrates an exemplary sample/hold circuit 300 for an ADC with synchronous sampling of the dual inputs. Specifically, sample/hold circuit 300 simultaneously captures both I and Q input signals and then buffers the stored I and Q signals in a time-multiplexed manner. A subsequent ADC circuit can digitize those buffered I and Q samples.

In this embodiment, capacitors 301-304 can store the I and Q inputs. In other embodiments, other types of storage devices can be used to store the I and Q inputs. In sample/hold circuit 300, the first terminals of capacitors 301-304 are selectively connected to the $I_p$, $I_n$, $Q_p$, and $Q_n$ input terminals, respectively, using a switch set 305.

The second terminal of capacitor 301 can be selectively connected to a positive input terminal of an amplifier 310 using a first switch 306(1) of a switch set 306. Note that although a differential operational amplifier is described herein, other embodiments could include other types of high input impedance, high gain amplifiers. Note further that the terms "high input impedance" and "high gain" depend on the resolution of the ADC. For example, in a 10-bit ADC embodiment, a high gain could be in the range of 1000-2000. Moreover, the term "amplifier" can include other circuits, such as folded cascode devices, that perform the same or substantially the same functions as described herein.

The second terminal of capacitor 302 can be selectively connected to a negative input terminal of amplifier 310 using a second switch 306(2) of switch set 306. The second terminal of capacitor 303 can be selectively connected to the positive input terminal of amplifier 310 using a first switch 307(1) of a switch set 307. The second terminal of capacitor 304 can be selectively connected to the positive input terminal of amplifier 310 using a second switch 307(2) of switch set 307.

Note that second and third switch sets 306/307 can also selectively connect the first terminals of capacitors 301-304 to a plurality of feedback lines. In this embodiment, a third switch 306(3) of switch set 306 can selectively connect the first terminal of capacitor 301 to a first feedback line 311 connected to ADC output terminal OUT(N). A fourth switch 306(4) of switch set 306 can selectively connect the first terminal of capacitor 302 to a second feedback line 312 connected to ADC output terminal OUT(P). A third switch 307(3) of switch set 307 can selectively connect the first terminal of capacitor 303 to first feedback line 311. A fourth switch 307(4) of switch set 307 can selectively connect the first terminal of capacitor 304 to second feedback line 312. Sample/hold circuit 300 further includes a switch set 308 for selectively connecting the second terminals of capacitors 301-302 to a predetermined voltage 309. Note that predetermined voltage 309 can depend on the amplifier used. In one embodiment, predetermined voltage 309 can be a DC voltage in the range of 0.6-1.1 V.

Figure 3B:
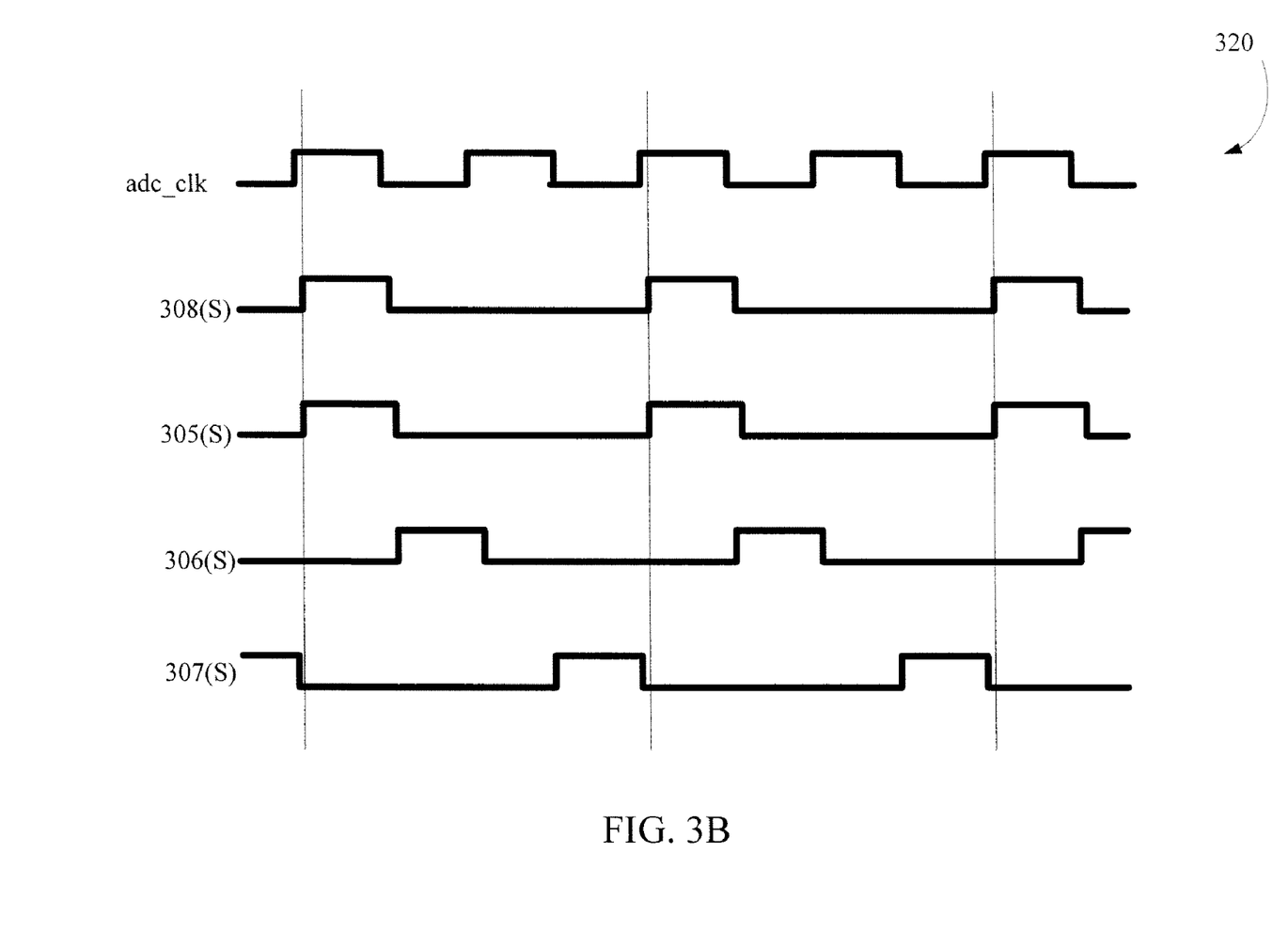
FIG. 3B illustrates exemplary waveforms for the ADC sample/hold circuit of FIG. 3A.

The timing and functioning of switch sets 305, 306, 307, and 308 are explained in reference to the waveforms 320 of FIG. 3B. In this embodiment, ADC clock signal adc_clk runs at twice the buffering rate, i.e. of switch sets 306 and 307 being closed by signals 306(S) and 307(S), respectively. In the above-described configuration of sample/hold circuit 300, closing the switches of switch sets 308 and 305 (signals 308(S) and 305(S) being high) while keeping the switches of switch sets 306 and 307 open (signals 306(S) and 307(S) being low) can charge capacitors 301-304 using the signals provided on the $I_p$, $I_n$, $Q_p$, and $Q_n$ input terminals. Thus, in this manner, capacitors 301-304 can be used to store the signal values of the ADC input terminals.

In one embodiment, signal 305(S) can be kept high slightly longer than signal 308(S). This technique takes into account that the switches of switch set 305 (which can be implemented with NMOS transistors) have turn off times that are dependent on the input signals. In contrast, the switches of switch sets 308 and 309 have turn off times independent of the input signals. Therefore, to ensure proper charging of capacitors 301-304, switch set 305 can remain closed slightly longer than switch set 308.

Once these values have been stored, the switches of switch sets 305 and 308 can be opened. At this point, the stored I and Q inputs can be buffered separately. In this embodiment, switches 306(1)-306(4) of switch set 306 can first be closed (signals 306(S) being high). Thus, the second terminal of capacitor 301 is connected to the positive input terminal of amplifier 310 via switch 306(1) and first feedback line 311 is connected to the first terminal of capacitor 301 via switch 306(3). Similarly, the second terminal of capacitor 302 is connected to the negative input terminal of amplifier 310 via switch 306(2) and second feedback line 312 is connected to the first terminal of capacitor 302 via switch 306(4). In this configuration, amplifier 310 forces its positive and negative inputs to be the equal in voltage without discharging the voltages stored by capacitors 301 and 302, respectively. Thus, the differential output voltage of the amplifier is effectively equal to the difference in the voltages stored by capacitors 301 and 302 (i.e. equal to the sampled I input voltages $I_p$-$I_n$). The output voltages of the sample/hold circuit can be digitized by a subsequent ADC circuit.

In a similar manner, at a subsequent time, switches 307(1)-307(4) of switch set 307 can be closed (signals 307(S) being high). Thus, the second terminal of capacitor 303 is connected to the positive input terminal of amplifier 310 via switch 307(1) and first feedback line 311 is connected to the first terminal of capacitor 303 via switch 307(3). Similarly, the second terminal of capacitor 304 is connected to the negative input terminal of amplifier 310 via switch 307(2) and second feedback line 312 is connected to the first terminal of capacitor 302 via switch 307(4). In this configuration, amplifier 310 forces its positive and negative inputs to be the equal in voltage without discharging the voltages stored by capacitors 303 and 304, respectively. Thus, the differential output voltage of the amplifier is effectively equal to the difference in the voltages stored by capacitors 303 and 304 (i.e. equal to the sampled Q input voltages $Q_p$-$Q_n$). The output voltages of the sample/hold circuit can be digitized by a subsequent ADC circuit.

In one embodiment, the ADC including sample/hold circuit 300 can buffer the I and Q inputs at a rate of up to 44 megasamples per second. Advantageously, this configuration and time-multiplexing allow an ADC including a sample/hold circuit 300 to be significantly smaller than conventional implementations of two single-input ADCs because an ADC including sample/hold circuit 300 requires only a single set of circuits to digitize the sample/hold circuit output.

Figure 4:
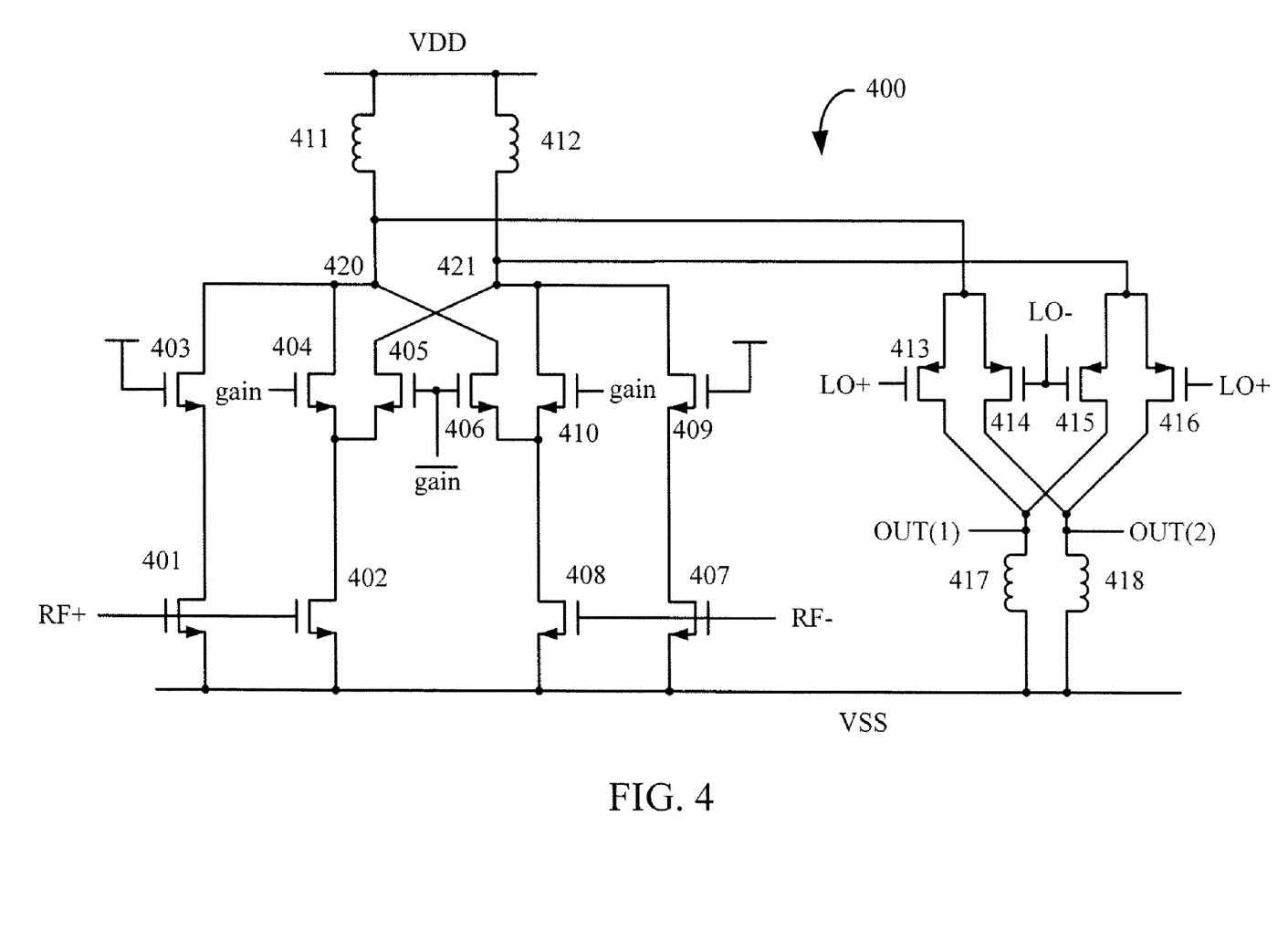
FIG. 4 illustrates a down conversion mixer with gain control.

FIG. 4 illustrates an exemplary down conversion mixer with gain control. In this embodiment, mixer 400 includes a first stage including (1) a first set of inductors and a plurality of first type transistors and (2) a second stage including a second set of inductors and a plurality of second type transistors.

For example, the first stage can include NMOS transistors 401 and 403 connected in series between a first voltage source (e.g. VSS) and a first node 420. Transistor 401 can receive the RF+ signal on its gate, whereas the gate of transistor 403 can be connected to a second voltage source (e.g. VDD). Similarly, NMOS transistors 402 and 404 can be connected in series between the first voltage source and the first node 420. In this case, transistor 402 also receives RF+ on its gate, whereas the gate of transistor 404 can receive a gain signal.

The first stage can further include NMOS transistors 407 and 409 connected in series between the first voltage source and a second node 421. Transistor 407 can receive the RF- signal on its gate, whereas the gate of transistor 409 can be connected to the second voltage source. Similarly, NMOS transistors 408 and 410 can be connected in series between the first voltage source and the second node 421. In this case, transistor 408 also receives RF- on its gate, whereas the gate of transistor 410 can receive the gain signal.

The first stage can further include NMOS transistors 405 and 406 that both receive a complementary gain signal on their gates. The source of transistor 405 is connected to a node between transistors 402 and 404, whereas the drain of transistor 405 is connected to node 421. In contrast, the source of transistor 406 is connected to a node between transistors 408 and 410, whereas the drain of transistor 405 is connected to node 420. An inductor 411 is connected between node 420 and the second voltage source, whereas an inductor 412 is connected between node 421 and the second voltage source.

The second stage can include PMOS transistors 413 and 414 that have sources connected to node 420. Transistor 413 can receive the local oscillator signal LO+ on its gate. Transistor 414 can receive the local oscillator signal LO- on its gate. The drain of transistor 413 can be connected to a first output terminal OUT(1) of mixer 400. The drain of transistor 414 can be connected to a second output terminal OUT(2) of mixer 400. An inductor 417 can be connected between the first output terminal and the first voltage source.

The second stage can further include PMOS transistors 415 and 416 that have sources connected to node 421. Transistor 415 can receive the local oscillator signal LO- on its gate. Transistor 416 can receive the local oscillator signal LO+ on its gate. The drain of transistor 415 can be connected to the first output terminal OUT(1) of mixer 400. The drain of transistor 416 can be connected to the second output terminal OUT(2) of mixer 400. An inductor 418 can be connected between the second output terminal and the first voltage source.

In this configuration, and in accordance with one aspect of the invention, the gain signal can be high (e.g. VDD), which logically makes the gain (bar) signal low (e.g. VSS) and vice versa. Transistors 401, 402, 407, and 408 convert the RF input voltage to current. Part of this current, which is generated by transistors 401 and 407, can be fed to inductors 411 and 412 through transistors 403 and 409 (because their gates are attached to VDD, transistors 403 and 409 are always on).

In a first state when the gain signal is high, transistors 404 and 410 are turned on and transistors 405 and 406 are turned off. In this first state, the rest of the RF current produced by transistors 402 and 408 is added to nodes 420 and 421. In a second state when the gain signal is low, transistors 405 and 406 are turned on and transistors 404 and 410 are turned off. In this second state, the rest of the RF current produced by transistors 402 and 408 is subtracted from nodes 420 and 421. Thus, switching the gain signal from high to low can effectively reduce the differential voltage across nodes 420 and 421, which will translate into a gain step.

Note that a conventional down conversion mixer would typically stack a differential pair (e.g. a Gilbert mixer) above an input differential pair. Unfortunately, this conventional configuration used with a low operating voltage (i.e. 1.8 V) creates non-linearity in the mixer output.

In contrast, in mixer 400, the inductor pair 411 and 412 can drive the PMOS transistors 413-416 in their folded configuration. The inductor pair 417 and 418 facilitate the generation of linear output signals. Thus, advantageously, the folded configuration of the PMOS transistors as well as the additional inductors allow mixer 400 to operate at the low operating voltage while maintaining output linearity.

Figure 5:
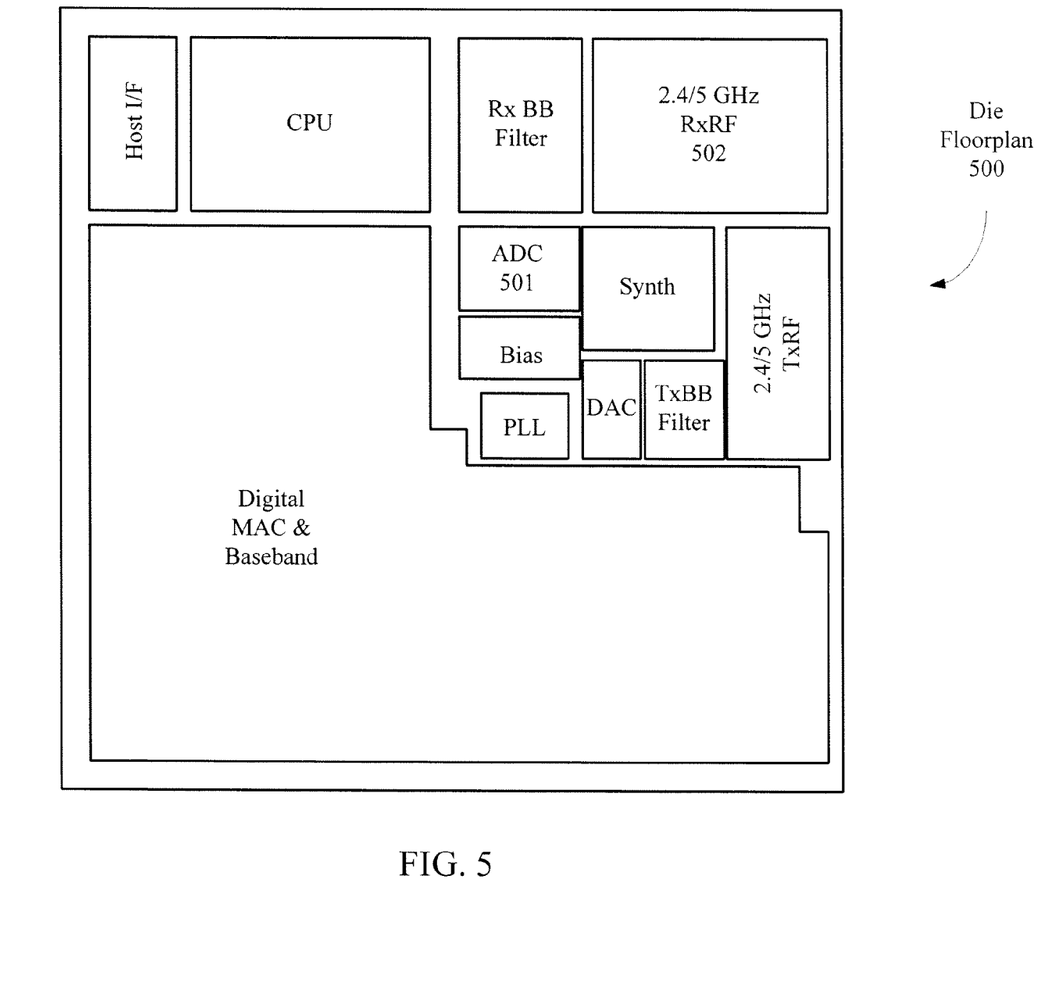
FIG. 5 illustrates an exemplary die floorplan of a dual-band WLAN SoC that could be fabricated in a standard 0.18 μm CMOS technology.

FIG. 5 illustrates an exemplary die floorplan 500 of a dual-band WLAN SoC that could be fabricated in a standard 0.18 μm CMOS technology. Note that ADC 501 can be implemented in part using sample/hold circuit 300 (FIG. 3A) whereas receiver 502 can includes mixers as implemented by mixer 400 (FIG. 4). In one embodiment, a 6.64 mm×6.72 mm die implementing the WLAN SoC could be packaged in a 2-layer, 216-pin BGA package. In one embodiment, the RF transceiver including the data converters, PLL and analog pads, occupies 13.5 mm$^2$ of the total die area.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, although sample/hold circuit 300 is described in reference to sampling differential signals, other embodiments can be implemented without differential signals. Additionally, although mixer 400 is shown with NMOS transistors in the first stage and PMOS transistors in the second, a more generic version can include a first type of transistor in the first stage and a second type of transistor in the second stage. For example, the first stage could include PMOS transistors and the second stage could include NMOS transistors, wherein inductors 411/412 would then be connected to VSS and inductors 417/418 would then be connected to VDD. Accordingly, it is intended that the scope of the invention be defined by the following Claims and their equivalents.

The invention claimed is:

1. A sample/hold circuit for an analog to digital converter (ADC), the sample/hold circuit comprising:
   an amplifier having positive and negative input terminals;
   first, second, third, and fourth capacitors, each capacitor having first and second terminals;
   a first switch set for selectively connecting the first terminals of the first, second, third, and fourth capacitors to $I_p$, $I_n$, $Q_p$, and $Q_n$ input terminals, respectively, of the ADC;
   a second switch set, the second terminal of the first capacitor being selectively connected to the positive input terminal of the amplifier using a first switch of the second switch set, and the second terminal of the second capacitor being selectively connected to the negative input terminal of the amplifier using a second switch of the second switch set;
   a third switch set, the second terminal of the third capacitor being selectively connected to the positive input terminal of the amplifier using a first switch of the third switch set, and the second terminal of the fourth capacitor being selectively connected to the positive input terminal of the amplifier using a second switch of the third switch set;
   first and second feedback lines, the first feedback line being connected to a positive output line of the amplifier, the second feedback line being connected to a negative output line of the amplifier, the first terminal of the first capacitor being selectively connected to the first feedback line using a third switch of the second switch set, the first terminal of the second capacitor being selectively connected to the second feedback line by a fourth switch of the second switch set, the first terminal of the third capacitor being selectively connected to the first feedback line using a third switch of the third switch set, the first terminal of the fourth capacitor being selectively connected to the first feedback line by a fourth switch of the third switch set; and
   a fourth switch set for selectively connecting the second terminals of the first, second, third, and fourth capacitors to a predetermined voltage.

2. A sample/hold circuit for an analog to digital converter (ADC), the sample/hold circuit comprising:
   an amplifier;
   first and second feedback lines, the first and second feedback lines being connected to output lines of the amplifier;
   first, second, third, and fourth capacitors;
   a first switch set for selectively connecting first terminals of the first, second, third, and fourth capacitors to differential I and Q input terminals of the ADC;
   a second switch set for selectively connecting second terminals of the first and second capacitors to input terminals of the amplifier and for selectively connecting the first terminals of the first and second capacitors to the first and second feedback lines;
   a third switch set for selectively connecting second terminals of the third and fourth capacitors to the input terminals of the amplifier and for selectively connecting the first terminals of the third and fourth capacitors to the first and second feedback lines; and
   a fourth switch set for selectively connecting the second terminals of the first, second, third, and fourth capacitors to a predetermined voltage.

3. A sample/hold circuit for an analog to digital converter (ADC), the sample/hold circuit comprising:
   an amplifier;
   first and second feedback lines, the first and second feedback lines being connected to output lines of the amplifier;
   first, second, third, and fourth capacitors;
   first means for selectively connecting first terminals of the first, second, third, and fourth capacitors to differential I and Q input terminals of the ADC;

second means for selectively connecting second terminals of the first and second capacitors to input terminals of the amplifier and for selectively connecting the first terminals of the first and second capacitors to the first and second feedback lines;

third means for selectively second terminals of the third and fourth capacitors to the input terminals of the amplifier and for selectively connecting the first terminals of the third and fourth capacitors to the first and second feedback lines; and fourth means for selectively connecting the second terminals of the first, second, third, and fourth capacitors to a predetermined voltage.

4. A sample/hold circuit for an analog to digital converter (ADC), the sample/hold circuit comprising:

an amplifier;

first and second feedback lines, the first and second feedback lines being connected to output lines of the amplifier;

first, second, third, and fourth storage devices;

first connecting devices for selectively connecting first terminals of the first, second, third, and fourth storage devices to differential I and Q input terminals of the ADC;

second connecting devices for selectively connecting second terminals of the first and second storage devices to input terminals of the amplifier and for selectively connecting the first terminals of the first and second storage devices to the first and second feedback lines;

third connecting devices for selectively second terminals of the third and fourth storage devices to the input terminals of the amplifier and for selectively connecting the first terminals of the third and fourth storage devices to the first and second feedback lines; and means for ensuring charging of the first, second, third, and fourth storage devices.

5. A method of running an analog to digital converter (ADC), the method comprising:

simultaneously storing an analog replica of differential I and Q input signals by charging a plurality of capacitors; and buffering stored differential I and Q input signals in a time-multiplexed sequence, wherein buffering the stored differential I and Q input signals includes:

transferring a differential I value stored by a first set of capacitors at a first time; and transferring a differential Q value stored by a second set of capacitors at a second time, wherein a sample/hold circuit for the ADC includes:

an amplifier;

first and second feedback lines, the first and second feedback lines being connected to output lines of the amplifier;

first, second, third, and fourth capacitors;

a first switch set for selectively connecting first terminals of the first, second, third, and fourth capacitors to differential I and Q input terminals of the ADC during the step of storing;

a second switch set for selectively connecting second terminals of the first and second capacitors to input terminals of the amplifier and for selectively connecting the first terminals of the first and second capacitors to the first and second feedback lines at a first time during the step of buffering;

a third switch set for selectively connecting second terminals of the third and fourth capacitors to the input terminals of the amplifier and for selectively connecting the first terminals of the third and fourth capacitors to the first and second feedback lines at a second time during the step of buffering; and a fourth switch set for selectively connecting the second terminals of the first, second, third, and fourth capacitors to a predetermined voltage during the step of storing.

6. A method of running an analog to digital converter (ADC), the method comprising:

simultaneously storing an analog replica of differential I and Q input signals by charging a plurality of capacitors; and buffering stored differential I and Q input signals in a time-multiplexed sequence, wherein buffering the stored differential I and Q input signals includes:

transferring a differential I value stored by a first set of capacitors at a first time; and transferring a differential Q value stored by a second set of capacitors at a second time, wherein a sample/hold circuit for the ADC includes:

an amplifier;

first and second feedback lines, the first and second feedback lines being connected to output lines of the amplifier;

first, second, third, and fourth capacitors;

a first switch set for selectively connecting first terminals of the first, second, third, and fourth capacitors to differential I and Q input terminals of the ADC during the step of storing;

a second switch set for selectively connecting second terminals of the first and second capacitors to input terminals of the amplifier and for selectively connecting the first terminals of the first and second capacitors to the first and second feedback lines at a first time during the step of buffering; and a third switch set for selectively connecting second terminals of the third and fourth capacitors to the input terminals of the amplifier and for selectively connecting the first terminals of the third and fourth capacitors to the first and second feedback lines at a second time during the step of buffering.

* * * * *